United States Patent
Liao

(10) Patent No.: US 12,019,368 B2
(45) Date of Patent: Jun. 25, 2024

(54) REMOVAL OF CONTAMINANTS FROM EUV MASKS

(71) Applicant: DUPONT ELECTRONICS, INC., Wilmington, DE (US)

(72) Inventor: Pen-Nan Liao, Hsinchu (TW)

(73) Assignee: DUPONT ELECTRONICS, INC., Wilmington, DE (US)

( * ) Notice: Subject to any disclaimer, the term of this patent is extended or adjusted under 35 U.S.C. 154(b) by 320 days.

(21) Appl. No.: 17/666,867

(22) Filed: Feb. 8, 2022

(65) Prior Publication Data

US 2022/0283495 A1 Sep. 8, 2022

Related U.S. Application Data

(60) Provisional application No. 63/156,492, filed on Mar. 4, 2021.

(51) Int. Cl.
  *G03F 1/82* (2012.01)
  *G03F 1/24* (2012.01)

(52) U.S. Cl.
  CPC . *G03F 1/82* (2013.01); *G03F 1/24* (2013.01)

(58) Field of Classification Search
  CPC ........................................................ G03F 1/82
  See application file for complete search history.

(56) References Cited

U.S. PATENT DOCUMENTS

| | | | |
|---|---|---|---|
| 9,665,000 B1 | 5/2017 | Shen et al. | |
| 9,740,095 B2 | 8/2017 | Lin et al. | |

*Primary Examiner* — Christopher G Young

(57) ABSTRACT

An aqueous cleaning composition containing sulfonic acids and a source of chloride ions is used to clean contaminants from EUV masks used in the manufacture of semiconductors. Optionally, the aqueous cleaning composition can include oxidizing agents and surfactants. The aqueous cleaning composition removes tin as well as other contaminants from the mask. Such other contaminants include, but are not limited to, aluminum oxide, etch and photoresist residues.

12 Claims, 1 Drawing Sheet

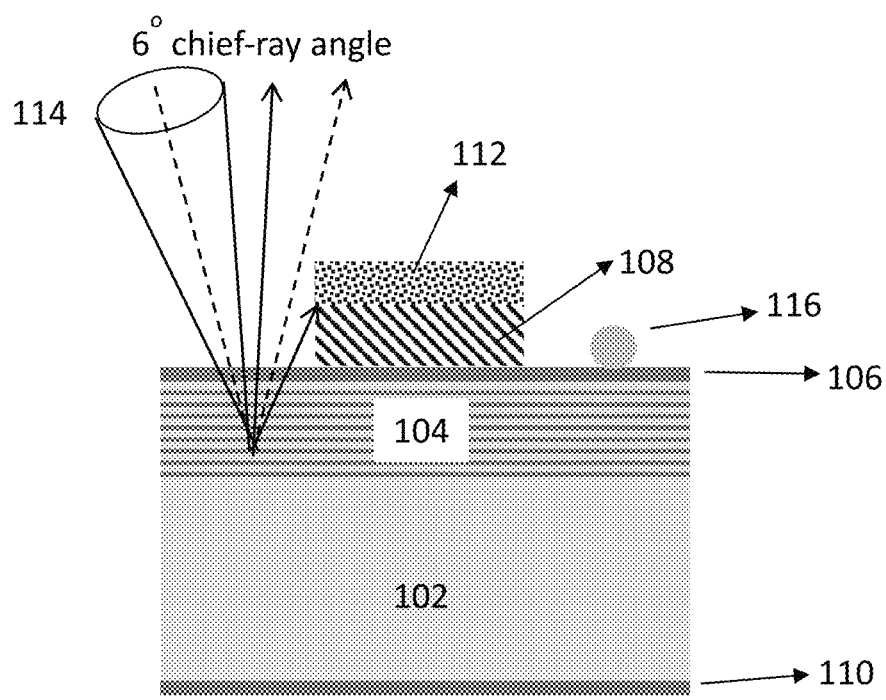

REMOVAL OF CONTAMINANTS FROM EUV MASKS

FIELD OF THE INVENTION

The present invention is directed to a method of removing contaminants from EUV masks using an aqueous solution containing sulfonic acids and chloride ions. More specifically, the present invention is directed to a method of removing contaminants from EUV masks using an aqueous solution containing sulfonic acids and chloride ions, wherein at least one of the contaminants removed from the EUV masks is tin.

BACKGROUND OF THE INVENTION

Extreme ultra-violet (EUV) photolithography is an advanced lithographic technique for semiconductor manufacturing. EUV light can be generated from laser produced tin plasma. Double-laser pulse shooting scheme was developed for higher tin ionization rates and higher conversion efficiency to ensure 13.5-nm high-power, i.e., greater than 200 watts, light source for high-volume semiconductor manufacturing (HVM). Even though some measures were developed to prevent tin from contaminating critical parts and optics in the manufacture of semiconductors, regular tool for periodic maintenance (PM) is still necessary for stable power throughput and to prevent pattern failure.

Pellicles, i.e., protective films, for EUV masks arrived relatively late for HVM. Without pellicles, contaminates e.g. environmental particles, alumina ($Al_2O_3$) particles, and tin, can contaminate EUV masks, thus causing mask defects. EUV masks must be cleaned regularly during lithographic processes to address the contamination problem. A standard cleaning composition for removing contaminants from EUV masks is an aqueous mixture of sulfuric acid and hydrogen peroxide (SPM). However, SPM causes obvious critical dimension (CD) loss of tantalum (Ta) based absorbers and anti-reflective coatings (ARC) of the EUV masks after about 30 cleaning runs. Besides CD loss of Ta based absorbers and ARCs, SPM has shown insufficient cleaning performance for removal of tin from EUV masks.

Accordingly, there is a need in the semiconductor manufacturing industry for a new composition and method for cleaning EUV masks, especially for cleaning tin from the EUV masks.

SUMMARY OF THE INVENTION

The present invention is directed to a method of removing contaminants from an extreme ultra-violet mask comprising:
a) inspecting the extreme ultra-violet mask for contaminants;
b) providing an aqueous cleaning composition consisting of water, a sulfonic acid or salt thereof, a source of chloride ions, optionally an oxidizing agent and optionally a surfactant; and
c) contacting the extreme ultra-violet mask with the aqueous cleaning composition to remove at least tin from the extreme ultra-violet mask.

The present invention is further directed to a method of removing contaminants from an extreme ultra-violet mask comprising:
a) inspecting the extreme ultra-violet mask for contaminants;
b) providing an aqueous cleaning composition consisting of water, a source of chloride ions, a sulfonic acid or salt thereof having the formula:

$$R-S(=O)_2-OH \qquad (I)$$

wherein R is an alkyl or aryl group, optionally an oxidizing agent and optionally a surfactant; and
c) contacting the extreme ultra-violet mask with the aqueous cleaning composition to remove at least tin from the extreme ultra-violet mask.

The methods and cleaning compositions of the present invention enable removal of at least tin from EUV masks and other contaminants, such as, but not limited to, alumina, etch residue and photoresist residue commonly found on EUV masks in the manufacture of semiconductors. The methods and cleaning compositions of the present invention also reduce or prevent substantial damage to EUV mask structural components, such as, but not limited to, capping layers and ARCs in comparison to many conventional cleaning compositions and processes for EUV masks. Additional advantages and improvements of the present invention can be appreciated by those of ordinary skill in the art by reading the specification and examples of the present application.

BRIEF DESCRIPTION OF THE DRAWING

FIGURE illustrates an EUV mask of the present invention showing various structural components and application of EUV light at a 6° chief-ray angle to a surface of the EUV mask.

DETAILED DESCRIPTION OF THE INVENTION

As used throughout the specification the abbreviations have the following meanings, unless the context clearly indicates otherwise: ° C.=degrees Centigrade; nm=nanometers; μg=micrograms; Å=angstroms; min=minutes; DI=deionized; UV=ultraviolet; EUV=extreme ultra-violet; EUVL=extreme ultra-violet lithography; ML=multi-layer; ARC=anti-reflective coating or layer; LTEM=low thermal expansion material; CVD=chemical vapor deposition; PVD=physical vapor deposition; PEB=post exposure baking; SPM=sulfuric acid+ hydrogen peroxide mixture; IC=integrated circuit; e-beam (electron beam); AFM=atomic force microscope; Temp=temperature; Al=aluminum, Cu=copper; C=carbon; S=sulfur; O=oxygen; H=hydrogen; Ru=ruthenium; Ta=tantalum; Ti=titanium; B=boron; Cr=chromium; N=nitrogen; Mo=molybdenum; Si=silicon; $K^+$=potassium cation; $Na^+$=sodium cation; $Al_2O_3$=aluminum oxide; HCl=hydrogen chloride; Nd=neodymium; YAG=yttrium-aluminum garnet; e-chuck=electrostatic chuck; POB=projection optics box; NA=numerical aperture; ER=etch rate; Ex=example; MSA=methanesulfonic acid; XPS=X-ray photoelectron spectrometer; ICP-MS=inductively coupled plasma mass spectrometry; ND=no damage; and wt %=weight percent.

The term "adjacent" means directly in contact with such that two metal layers have a common interface. The term "aqueous" means water or water-based. The terms "composition" and "solution" are used interchangeably throughout the specification. The terms "EUV mask", and "mask" are used interchangeably throughout the specification. The terms "resist" and "photoresist" are used interchangeably throughout the specification. The term "numerical aperture" is a physical index of optics. Amounts in % are weight % unless otherwise indicated. The terms "a" and "an" can refer to both the singular and the plural throughout the specification. All numerical ranges are inclusive and combinable in any order, except where it is logical that such numerical ranges are constrained to add up to 100%.

EUVL is a promising patterning technology for semiconductor technology nodes in the nanometer range, such as 14 nm, and smaller. EUVL as with optical lithography requires a photomask to print wafers, except that it employs light in the EUV region that ranges from about 1 nm to about 100 nm. Preferably, light used in the EUVL process is about 13.5 nm. At the wavelength of 13.5 nm, many materials are highly absorbing. Thus, reflective optics, rather than refractive optics, are commonly used in EUVL. During the EUVL process the EUV mask should be kept as clean as possible to avoid contamination and defects of circuitry formed on semiconductor substrates and optics used in the lithographic process.

The method of the present invention involves providing a EUV mask. The EUV mask is used to fabricate semiconductor wafers during lithography exposing processes. The EUV mask includes a substrate and a pattern formed thereon or to be formed on the substrate. The pattern is defined according to a circuit design. On the backside of the substrate is a conductive layer for electrostatic chucking purposes. In the present invention, the mask is a reflective mask to be used in an extreme ultraviolet lithography. An exemplary reflective mask 100 is illustrated in the FIGURE in sectional view. The reflective mask 100 includes a substrate 102, a reflective ML 104 deposited on the substrate 102, a capping layer 106 deposited on the reflective ML 104, and a patterned absorption layer 108 deposited on the capping layer 106. The mask further includes a conductive layer 110 on the backside of the substrate typically made of CrN or other conductive material. An ARC 112 is adjacent to the absorption layer 108. ARC materials include, but are not limited to, tantalum boron oxide (TaBO). The ARC allows better visualization of any defective images by reducing the intensity of inspection actinic light.

The substrate 102 includes an LTEM. The substrate 102 serves to minimize image distortion due to mask heating by the intensified illumination radiation. The LTEM can include fused silica, fused quartz, calcium fluoride, silicon carbide, silicon oxide-titanium oxide alloy or other suitable LTEM known in the art. The substrate 102 includes materials with a low defect level and a smooth surface. The reflective ML 104 is deposited on the substrate 102 by conventional processes known in the art such as by CVD or PVD. According to Fresnel equations, light reflection occurs when light propagates across the interface between two materials of different refractive indices. The reflected light is greater when the difference of refractive indices is greater. To increase the reflected light, one can also increase the number of interfaces by depositing the reflective ML 104 of alternating materials and let light reflected from different interfaces interfere constructively by choosing appropriate thicknesses for each layer of the reflective ML 104. However, the absorption of the reflective ML 104 limits the highest reflectivity that can be achieved. The reflective ML 104 includes a plurality of film pairs, such as molybdenum-silicon (Mo/Si) film pairs (e.g., a layer of molybdenum above or below a layer of silicon in each film pair). Alternatively, the reflective ML 104 can include molybdenum-beryllium (Mo/Be) film pairs, or any material that is highly reflective at EUV wavelengths can be utilized for the reflective ML 104. The thickness of each layer of the reflective ML 104 depends on the EUV wavelength and the incident angle. The thickness of the reflective ML 104 is adjusted to achieve a maximum constructive interference of the EUV light reflected at each interface and a minimum absorption of the EUV light by the reflective ML 104. The reflective ML 104 can be selected such that it provides a high reflectivity to a selected radiation type/wavelength. A typical number of film pairs is 20-80, however, any number of film pairs can be used. In some embodiments, the reflective ML 104 includes forty pairs of layers of Mo/Si. In one example, each Mo/Si film pair has a thickness of about 7 nm, with a total thickness of 280 nm, and thereby a reflectivity of about 70% is achieved.

The capping layer 106 is deposited on the reflective ML 104 by conventional CVD or PVD processes well known in the art. Because the capping layer 106 has different etching characteristics from an absorption layer, the capping layer 106 acts as an etch stop layer in a subsequent patterning or a repairing process of the absorption layer. The capping layer 106 includes Ru or alternatively Ru compounds, such as ruthenium-boron (RuB) or ruthenium-silicon (RuSi).

The absorption layer 108 is deposited on the capping layer 106 also by conventional CVD or PVD processes and then is patterned to form the main pattern according to an IC design layout using conventional imaging processes. In some embodiments, the absorption layer 108 absorbs a radiation beam projected on it as shown in the FIGURE. The absorption layer 108 can include a single layer or multiple layers from a group of tantalum boron nitride (TaBN), chromium (Cr), chromium oxide (CrO), titanium nitride (TiN), tantalum nitride (TaN), tantalum (Ta), titanium (Ti), or aluminum-copper (Al—Cu), palladium, aluminum oxide (AlO), molybdenum (Mo), or other suitable materials. Preferably, the absorption layer is TaBN. The patterning of the absorption layer 108 includes a lithography patterning process and etching using conventional processes known in the art. The lithography patterning process further includes forming a resist layer sensitive to the EUV light by spin-on coating; exposing the resist layer using e-beam in a proper mode, such as direct e-beam writing; and developing the exposed resist layer to form a patterned resist layer that includes a plurality of openings defining a circuit pattern. The lithography patterning process can include other operations, such as PEB. An etching process is applied to the absorption layer 108 through the openings of the patterned resist layer to pattern the absorption layer 108 using the patterned resist layer as an etch mask. Afterward, the patterned resist layer is removed by plasma ashing or wet stripping. The resist material can be a positive acting or negative acting photoresist. Photoresists are well known in the art. Conventional photoresists can be used to practice the present invention.

The mask 100 is used in a lithography exposing process when patterning a semiconductor wafer. As shown in the FIGURE, when an illumination beam 114 of EUV light generated from tin plasma is projected on the mask 100, a portion of the illumination beam 114 projected on the absorption layer 108 is absorbed by the absorption layer 108 and another portion of the illumination beam 114 projected on the reflective ML 104 is reflected by the reflective ML 104. Solid lines indicate EUV light beam focused on the EUV mask. The dotted lines indicate the light beam direction. A patterned illumination beam is thereby generated. The light beam is generated by a conventional EUV light generator equipped with a Nd:YAG laser and carbon dioxide laser. The best performance of light incident angle is a 6° incident light angle which has high reflectivity and low light diffraction at current NA=0.33 EUV lithography scanner. The patterned illumination beam is used to expose a resist film coated on a semiconductor wafer. Preferably, the illumination beam is generated from laser produced tin plasma. Upon subsequent additional lithography operations, such as PEB and developing, a resist pattern is formed on the wafer and can be used as an etch mask during an etching process or as an implantation mask during an ion implantation.

One challenge of using a reflective EUV lithography technique occurs when a defect appears in or on a reflective EUV mask. While a relatively small defect may not be significantly detrimental when using a transmissive mask, a similar defect may be significant when using a reflective EUV mask for various factors, such as reduced feature sizes of the circuit pattern on the mask 100. Therefore, a quality or integrity of the corresponding exposed image is impacted by the defect on the mask 100.

A method of the present invention preferably includes inspecting the mask 100 to identify one or more defect using a mask inspection tool, such as an optical inspection tool, an AFM or other suitable inspection tool. A commercially available mask inspection tool is MATRICS™ X800 from Lasertec Corporation. Bruker is a pioneer AFM supplier. Inspecting the mask 100 includes scanning a surface of the mask, locating a defect on the mask, and determining the shape and the size of the defect. The defects on the mask include two types of defect: hard defects and soft defects. The hard defects refer to the defects that cannot be removed by a cleaning process. Therefore, the present invention is directed to removing soft defects.

The soft defects refer to defects that can be removed by the cleaning process of the present invention, such as, but not limited to, particles, tin, aluminum oxide and resist residue. The method of the present invention is especially effective for removing tin from the EUV mask without substantially damaging the tantalum based components of the mask, such as, but not limited to, the ARC and absorption layer, and the components of the capping layer, which preferably includes ruthenium and ruthenium based compounds. Tin contaminants on the mask are typically generated during application of the laser produced tin plasma, as mentioned above. The FIGURE illustrates an exemplary soft defect 116 formed on the capping layer 106, wherein the capping layer includes Ru.

The method proceeds by performing a cleaning process to a EUV mask, thereby removing the soft defects. The cleaning process includes applying an aqueous cleaning composition comprising sulfonic acid or salt thereof and a source of chloride ions to the EUV mask such as the EUV mask 100 shown in the FIGURE. A pH of the aqueous cleaning composition is less than 1.

Preferably, the sulfonic acid of the cleaning composition of the present invention has the formula:

$$R-S(=O)_2-OH \qquad (I),$$

wherein R is an organic group selected from the group consisting of alky and aryl groups. Alkyl groups have the general formula: $C_nH_{2n+1}$, wherein the variable n is an integer of 1 and greater, preferably, n is an integer from 1 to 4, more preferably, n is an integer from 1 to 3, most preferably, n is 1 or 2. Preferably, R is selected from the group consisting of methyl, ethyl, propyl, isopropyl, butyl, and isobutyl, more preferably, R is selected from the groups consisting methyl, ethyl, propyl, and isopropyl, most preferably, R is selected from the group consisting of methyl and ethyl. Examples of the more preferred alkyl sulfonic acids are methane sulfonic acid, ethane sulfonic acid and propane sulfonic acid and salts thereof. Examples of the most preferred are methane sulfonic acid and ethane sulfonic acid and salts thereof with methane sulfonic acid and its salts chosen over ethane sulfonic acid and its salts.

Aryl groups of R include, but are not limited to, substituted or unsubstituted benzene or benzyl groups. Substituent groups include, but are not limited to, hydroxyl, $C_1$-$C_3$ hydroxyalkyl, $C_1$-$C_3$ alkoxy and $C_1$-$C_3$ alkyl. Preferably, R is selected from the group consisting of benzene, hydroxybenzene and tolyl, more preferably, R is selected from the groups consisting of benzene and hydroxybenzene. Examples of preferred aryl sulfonic acids are benzene sulfonic acid, 4-hydroxybenzene sulfonic acid and toluene sulfonic acid, most preferably, para-toluene sulfonic acid.

Salts of the sulfonic acids can also be included in the cleaning compositions of the present invention. The salts can be used alone or, preferably, in combination with one or more of the sulfonic acids described above. Salts of the sulfonic acids have the general formula:

$$R-S(=O)_2-O^-Y^+ \qquad (II),$$

wherein R is defined above and $Y^+$ is a counter cation to neutralize the sulfonate anion. Preferably, $Y^+$ is $K^+$ or $Na^+$, more preferably, $Y^+$ is $K^+$. Examples of preferred sulfonate salts are potassium methanesulfonate, sodium methanesulfonate and sodium ethanesulfonate. More preferably, the sulfonate salts are potassium methanesulfonate and sodium methanesulfonate.

Preferably in the aqueous cleaning compositions of the present invention, the alkyl sulfonic acids, salts thereof or mixtures thereof, described above, are included in the aqueous cleaning compositions. Preferred alkyl sulfonic acids are selected from the group consisting of methanesulfonic acid and ethanesulfonic acid and $K^+$ or $Na^+$ salts thereof. The most preferred are methanesulfonic acid and its $K^+$ and $Na^+$ salts.

Sufficient amounts of one or more of the sulfonic acids and salts thereof are included in the aqueous cleaning compositions of the present invention to remove contaminants from EUV masks without substantial damage to the mask components, such as the ARC, capping layer, absorption layer, ML and LTEM layers, especially the components which include Ta and Ru compounds. Preferably, sufficient amounts of the sulfonic acids and salts thereof are included in the aqueous cleaning compositions of the present invention to at least remove Sn ions from the EUV mask. Other contaminants which can be removed from the EUV mask components with the cleaning compositions of the present invention, include, but are not limited to, $Al_2O_3$, resist, such as photoresist, etch residue and particles, such as environmental particles. Preferably, the sulfonic acids and salts thereof are included in the aqueous cleaning compositions in amounts of at least 10 wt %, preferably, at least 15 wt %, more preferably, from 15-65 wt %, most preferably, from 40-65 wt %.

The aqueous cleaning compositions of the present invention also include chloride ions. Water soluble compounds which provide chloride ions and do not substantially contaminate the EUV mask can be used as a source of chloride ions. Preferably, HCl is the source of chloride ions.

Preferably, one or more sources of chloride ions are included in the aqueous cleaning compositions to provide at least 0.05 wt % of chloride ions. More preferably, one or more sources of chloride ions are included in the aqueous cleaning compositions to provide 0.1-5 wt % chloride ions, most preferably, one or more sources of chloride ions are included in the cleaning compositions of the present invention to provide 0.1-2 wt % chloride ions.

Optionally, the aqueous cleaning composition can include an oxidizing agent. Conventional oxidizing agents can be used. Such oxidizing agents include, but are not limited to, hydrogen peroxide, peroxydisulfuric acid, peroxymonosulfuric acid and perchloric acid. Preferably, the oxidizing agent is hydrogen peroxide. Oxidizing agents can be included in the aqueous cleaning compositions of the present invention in amounts of 0.5-5 g/100 g of the aqueous cleaning composition, preferably, from 0.5-2 g/100 g of the aqueous cleaning composition.

Optionally, the aqueous cleaning composition can include a surfactant. Such surfactants include non-ionic surfactants, cationic surfactants, anionic surfactants and amphoteric surfactants. Preferably, the surfactant is non-foaming. More preferably, the surfactant is an anionic surfactant. Most preferably, the surfactant is a non-foaming, anionic surfactant, such as dodecyl diphenyl oxide disulfonic acid commercially available as CALFAX® DBA-70 from Pilot Chemical Corp. Surfactants can be included in conventional amounts.

Preferably, the aqueous cleaning composition of the present invention consists of one or more sulfonic acids and salts thereof, one or more sources of chloride ions to provide chloride ions to the cleaning composition, optionally an oxidizing agent, optionally a surfactant and water. Preferably, the sulfonic acids are sulfonic acids having formula (I) described above and the salts thereof have formula (II) described above. Preferably, the source of chloride ions is HCl.

More preferably, the aqueous cleaning composition of the present invention consists of methane sulfonic acid or salt thereof in amounts of 15-65 wt %, chloride ions in amounts of 0.1-5 wt % and water.

Most preferably, the aqueous cleaning composition of the present invention consists of methane sulfonic acid or salt thereof in amounts of 40-65 wt %, chloride ions in amounts of 0.1-2 wt %, wherein a source of the chloride ions is HCl, and water.

Optionally, the method of the present invention can include another inspection operation to further check if the EUV mask is cleaned to meet the mask specifications for semiconductor manufacture. If further cleaning is required, the mask cleaning method described above can be repeated. The cleaning method can be repeated as many times as needed to achieve the desired cleanliness for the EUV mask.

The aqueous cleaning composition of the present invention can be applied to the EUV mask for cleaning by conventional methods know in the art. The EUV mask can be immersed in the cleaning composition for a sufficient time to remove contaminants from the mask. Optionally, the mask can then be rinsed with water. The cleaning composition can be sprayed on the mask followed by rinsing the mask with water. One example of a commercial cleaning tool is MaskTrack Pro from SUSS MicroTec Inc.

The cleaning composition of the present invention is used at temperatures of preferably at least 30° C., more preferably, 50-85° C., most preferably, from 55-80° C.

Sufficient time exposure of the EUV mask with the aqueous cleaning composition of the present invention can vary depending on the contaminants or defects on the mask and where the contaminants are located, such as on the ARC, absorption layer or capping layer and the material composition of the contaminated layer. For example, tin is the most difficult to remove from EUV masks. Removing photoresist contaminants from the masks can also be challenging due to the varying compositional make-up of the photoresists. In general, the EUV masks are exposed to the cleaning composition for at least 1 min, or such as from 5-30 min, or such as from 5-10 min. Contaminants which are especially difficult to remove, such as tin, can require multiple cleaning runs or cycles, wherein each cleaning cycle can vary in time. The amounts of contaminants removed can be measured by any suitable process and apparatus known in the art. An example of a process for measuring the contaminants, especially tin, is ICP-MS.

During lithography exposing processes using the mask to pattern a semiconductor wafer, the mask can be easily contaminated requiring multiple cleans during the lithography process. Preferably, the EUV mask is cleaned at the end of the lithography process after significant contaminants have accumulated on one or more of the layers of the EUV mask.

The specific steps, materials and apparatus can vary for lithographic semiconductor wafer manufacture. In general, the method begins by loading the mask into a lithography system. Preferably, the lithography system is a EUV lithography system designed to expose a resist layer by EUV light. The resist layer is a material sensitive to the EUV light, such as a negative acting or positive acting photoresist. The EUV lithography system includes a radiation source to generate EUV light, such as EUV light having a wavelength ranging between about 1 nm and about 100 nm. For example, the radiation source generates a EUV light with a wavelength centered at about 13.5 nm. An example of a commonly used radiation source is a laser produced by Sn plasma. Such Sn plasma generates Sn ions which often results in the contamination of the EUV mask with Sn, as mentioned above. The lithography system also includes an illuminator. In various embodiments, the illuminator includes various reflective optic parts, such as a single mirror or a mirror system having multiple mirrors, to direct light from the radiation source onto a mask stage. The lithography system includes a mask stage configured to secure the mask. In some embodiments, the mask stage includes an e-chuck to secure the mask. The lithography system also includes a projection optics module or POB for imaging the pattern of the mask on to a semiconductor substrate secured on a substrate stage of the lithography system. The POB has reflective optics for projecting the EUV light. The EUV light, which carries the image of the pattern defined on the mask, is directed from the mask and is collected by the POB. The illuminator and the POB are collectively referred to as an optical module of the lithography system. The lithography system also includes a substrate stage to secure the semiconductor substrate.

The semiconductor wafer is coated with a resist layer sensitive to the EUV beam. The wafer can be a silicon wafer or alternatively can include additional semiconductor material. Such additional semiconductor material can include germanium; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP.

In yet another alternative, the semiconductor wafer includes a semiconductor on insulator (SOI) structure. In other embodiments, the semiconductor wafer also includes one or more conductive or dielectric films. In some embodiments, the dielectric film can include silicon oxide, high k dielectric material film, or a combination of silicon oxide and high k dielectric material, and the conductive thin film for the gate electrode film may include doped polysilicon, or a metal, such as aluminum (Al), copper (Cu), tungsten (W), nickel (Ni), titanium (Ti), gold (Au), platinum (Pt) or alloy of the metals thereof.

An example of an EUV lithographic method includes performing a lithography exposing process to a resist layer using the EUV mask in the EUV lithography system. During the method, the generated EUV radiation is illuminated on the mask by the illuminator, and is further projected on the resist layer coated on the wafer by the POB, thereby forming a latent image on the resist layer. In some embodiments, the lithography exposing process is implemented in a scan mode. The resist layer can be removed by wet stripping or plasma ashing.

The following examples are included to further illustrate the invention but are not intended to limit its scope.

EXAMPLES 1-6

Tin Particle Removal From Semiconductor Wafers

Aqueous based sulfonic acid cleaning compositions were prepared as shown in Table 1 below. The pH of the cleaning compositions was less than 1. Semiconductor wafers containing particles of PVD tin were provided by Triomax Technology Co., Ltd. The wafers were cut into 2.8 cm×2.8 cm size coupons. The semiconductor wafers included particles of tin as opposed to homogeneous films of tin to mimic tin on EUV photomasks after tin plasma deposition.

The tin particle containing semiconductor wafer coupons were then immersed in 100 g of the solutions (weight of water+weight of components) disclosed in Table 1 below for the time and temperature listed in Table 1. The 0.5 g 31% $H_2O_2$ was mixed with 99.5 g of the solution just prior to immersing the coupons in the cleaning solution because of the instability of the $H_2O_2$ when combined with other compounds. Each solution was then analyzed for dissolved tin ions by ICP-MS.

TABLE 1

| Component | Ex-1 | Ex-2 | Ex-3 | Ex-4 | Ex-5 | Ex-6 |
|---|---|---|---|---|---|---|
| MSA (wt %) | 10 | 20 | 20 | 40 | 20 | 0 |
| 1-propane-sulfonic acid (wt %) | 0 | 0 | 0 | 0 | 0 | 5 |
| HCl (wt %) | 0.18 | 0.18 | 0.18 | 0.18 | 0.18 | 0.18 |
| CALFAX ™ DBA-70 surfactant (wt %) | 0 | 0 | 0 | 0 | 0.01 | 0 |
| 31% $H_2O_2$ (g/100 g) | 0.5 | 0.5 | 2 | 2 | 0.5 | 1 |
| Temp ° C. | 60 | 60 | 80 | 80 | 60 | 80 |
| Dipping time (min) | 10 | 10 | 5 | 5 | 10 | 10 |
| Dissolved Sn (µg) | 58.4 | 155.3 | 4.6 | 49 | 131.6 | 19.05 |

EXAMPLES 7-9 (COMPARATIVE)

Tin Particle Removal From Semiconductor Wafers

Aqueous based sulfonic acid cleaning compositions were prepared as shown in Table 2 below. The pH of the cleaning compositions was less than 1.

The procedure for determining the amount of tin removed from tin particle containing semiconductor wafer coupons was repeated as disclosed in Examples 1-6 above except using the aqueous based sulfonic acid cleaning compositions disclosed in Table 2.

TABLE 2

| Component | Ex-7 | Ex-8 | Ex-9 |
|---|---|---|---|
| MSA (wt %) | 2 | 10 | 20 |
| 31% $H_2O_2$ (g/100 g) | 0.5 | 0.5 | 0.5 |
| Temp ° C. | 60 | 60 | 60 |
| Dipping time (min) | 10 | 10 | 10 |
| Dissolved Sn (µg) | 0.6 | 3.4 | 18.1 |

The ICP-MS analysis for tin ions in the solutions of Table 2 showed a significant reduction in the amount of tin ions in the aqueous cleaning solutions in contrast to the tin ions in the solutions of Examples 1-6. The aqueous sulfonic acid cleaning compositions which included the combination of MSA and HCl showed overall significant improvement in tin removal than the aqueous cleaning compositions which did not include the MSA and HCl combination.

EXAMPLES 10-13 (COMPARATIVE)

Tin Particle Removal From Semiconductor Wafer

Aqueous based sulfonic acid cleaning compositions were prepared as shown in Table 3 below. The pH of the cleaning compositions was less than 1.

The procedure for determining the amount of tin removed from tin particle containing semiconductor wafer coupons was repeated as disclosed in Examples 1-6 above except using the aqueous based sulfonic acid cleaning compositions disclosed in Table 3.

TABLE 3

| Component | Ex-10 | Ex-11 | Ex-12 | Ex-13 |
|---|---|---|---|---|
| MSA (wt %) | 2 | 5 | 5 | 5 |
| Citric acid (wt %) | 0.2 | 0.2 | 0.2 | 0.2 |
| 31% $H_2O_2$ (g/100 g) | 0.5 | 0.5 | 1 | 2 |
| Temp ° C. | 60 | 60 | 60 | 60 |
| Dipping time (min) | 10 | 10 | 10 | 10 |
| Dissolved Sn (µg) | 0.6 | 0.8 | 1.2 | 3.6 |

Replacing HCl with the organic acid citric acid resulted in marked reduction of tin removal from the semiconductor wafer coupons in contrast to the aqueous cleaning compositions containing MSA and HCL in Examples 1-6.

EXAMPLES 14-15

Tin Particle Removal From Semiconductor Wafers

Aqueous based sulfonic acid and SPM cleaning compositions were prepared in DI water. The pH of the cleaning compositions was less than 1. SPM (sulfuric acid/peroxide mixture) was composed of sulfuric acid 96% by weight: hydrogen peroxide 31% by weight (10:1 volume ratio).

The procedure for determining the amount of tin removed from tin particle containing semiconductor wafer coupons was repeated as disclosed in Examples 1-6 above.

TABLE 4

| Component | Ex-14 | Ex-15 |
|---|---|---|
| MSA (wt %) | 60 | 30 |
| HCl (wt %) | 0.09 | 0.18 |
| H$_2$O$_2$ 31% (g/100 g) | 2 | 2 |

The semiconductor wafer coupons containing tin particles were dipped in the aqueous cleaning solutions for either 0.5 min or 1 min. The solutions were at 80° C. during dipping. The amount of tin removed from the coupons is shown in Table 5 below.

TABLE 5

| Dipping Time (min) | Dissolved Tin (μg) Ex-14 | Dissolved Tin (μg) Ex-15 | Dissolved Tin (μg) SPM |
|---|---|---|---|
| 0.5 | 0.3 | 0.48 | 0.25 |
| 1 | 0.57 | 1.47 | 0.40 |

The results in Table 5 show that the aqueous cleaning solutions of the present invention had improved tin removal versus the conventional SPM cleaning composition.

EXAMPLES 16-17

Damage to TaBo and Ru

Aqueous based sulfonic acid and SPM cleaning compositions were prepared in DI water. The pH of the cleaning compositions was less than 1. SPM (sulfuric acid/peroxide mixture) was composed of sulfuric acid 96% by weight: hydrogen peroxide 31% by weight (10:1 volume ratio).

Three EUV photomask substrates containing 3.5 nm thick Ru and 2 nm thick TaBO homogeneous films were obtained from Toppan photomask Inc. Each EUV photomask substrate was cut into 3 cm×3 cm size coupons. The coupons were immersed in the two aqueous cleaning compositions disclosed in Table 6 and SPM for 1 min at 80° C. After 1 min the coupons were removed and the concentration of the Ru and TaBO in the aqueous cleaning solutions was measured using ICP-MS.

TABLE 6

| Component | Ex-16 | Ex-17 |
|---|---|---|
| MSA (wt %) | 60 | 30 |
| HCl (wt %) | 0.09 | 0.18 |
| H$_2$O$_2$ 31% (g/100 g) | 2 | 2 |
| Solution (g) | 98 | 98 |

The etch rate for Ru and TaBO was determined using the following equation:

$$ER(Å/min) = c(ppb) \times w(g)/D(g/cm^3) \times A(cm^2) \times t(min) \times 10, \quad \text{equation (I)},$$

where c is concentration of Ru or TaBO in solution, w is weight of cleaning solution, A is area of coupons, t is time the coupons were dipped in the cleaning solution and D is density of Ru or TaBO. Ru density is 12.45 g/cm$^3$ and TaBO density is 14.3 g/cm$^3$.

TABLE 7

| Etch Material | Ex-16 | Ex-17 | SPM |
|---|---|---|---|
| TaBO ER (Å/min) | 0.050 | 0.092 | 0.02 |
| Ru ER (Å/min) | 0.014 | 0.009 | ND |

Although SPM showed no detectable Ru in solution, Ex-16 and Ex-17 still showed very small Ru etch rates indicating that the MSA containing solutions caused insignificant damage to the Ru film.

SPM showed the least amount of damage to the TaBO film, however, the MSA containing solutions still caused insignificant damage to the TaBO films.

EXAMPLES 18-22

Al$_2$O$_3$ Removal From Silicon Wafers

Aqueous based sulfonic acid cleaning compositions were prepared as shown in Table 8. The pH of the cleaning compositions was less than 1.

Silicon wafers coated with 2,000 Å alumina thick film were immersed in the cleaning solutions disclosed in Table 8 for 10 min. The wafers were removed and the Alumina film thickness was measured with an XPS. Etch rate was determined with equation (II) where h$_0$ is film thickness before dipping and h is film thickness after dipping. t is dipping time in min. $ER(Å/min) = h_0 - h/t$, equation (II)

TABLE 8

| Component/Conditions | Ex-18 | Ex-19 | Ex-20 | Ex-21 | Ex-22 |
|---|---|---|---|---|---|
| MSA (wt %) | 20 | 10 | 20 | 10 | 20 |
| Citric acid (wt %) | 0 | 0.2 | 0.2 | 0 | 0 |
| HCl (wt %) | 0 | 0 | 0 | 0.18 | 0.18 |
| H$_2$O$_2$ (g) | 1 | 1 | 1 | 1 | 1 |
| Temp ° C. | 80 | 80 | 80 | 80 | 80 |
| Dipping time (min) | 10 | 10 | 10 | 10 | 10 |
| Al$_2$O$_3$ ER (Å/min) | 16.6 | 5.4 | 7.8 | 24.1 | 20.4 |

Ex-21 and Ex-22 which were cleaning solutions of the present invention had the highest ER rate for alumina.

EXAMPLES 23-24 (COMPARATIVE)

Conventional Tin Etch Removal Formulation

Aqueous based sulfonic acid cleaning compositions were prepared as shown in Table 9. The pH of the cleaning compositions was less than 1. The aqueous cleaning compositions were conventional cleaning compositions used to strip tin from printed circuit boards. However, upon preparing the solutions, they were found to be non-homogeneous and unsuitable for cleaning semiconductor wafers. Insoluble residue was observed precipitating out of solution.

TABLE 9

| Component | Ex-23 (wt %) | Ex-24 (wt %) |
|---|---|---|
| MSA | 10 | 50 |
| Alkylphenol ethoxylate | 1 | 4 |
| Polyethyleneglycol 1000 | 0.5 | 3.5 |
| Ethylene glycol | 0.1 | 0.5 |

TABLE 9-continued

| Component | Ex-23 (wt %) | Ex-24 (wt %) |
|---|---|---|
| Citric acid | 0.1 | 0.4 |
| HCl | 0.1 | 0.4 |
| Benzotriazole | 10 | 15 |
| DI water | 78.2 | 26.2 |

EXAMPLES 25-30

Tin Particle Removal From Semiconductor Wafers

Aqueous based sulfonic acid cleaning compositions were prepared as shown in Table 10 below. The pH of the cleaning compositions was less than 1. Semiconductor wafers containing particles of PVD tin were provided by Triomax Technology Co., Ltd. The wafers were cut into 2.8 cm×2.8 cm size coupons. The semiconductor wafers included particles of tin as opposed to homogeneous films of tin to mimic tin on EUV photomasks after tin plasma deposition.

The tin particle containing semiconductor wafer coupons were then immersed in 100 g of the solutions (weight of water+weight of components) disclosed in Table 10 below for the time and temperature listed in Table 10. The 1 g 31% $H_2O_2$ was mixed with 99 g of the solution just prior to immersing the coupons in the cleaning solution because of the instability of the $H_2O_2$ when combined with other compounds. Each solution was then analyzed for dissolved tin ions by ICP-MS.

TABLE 10

| Component | Ex-25 | Ex-26 | Ex-27 | Ex-28 | Ex-29 | Ex-30 |
|---|---|---|---|---|---|---|
| Bezenesulfonic acid (wt %) | 5 | 5 | 5 | | | |
| p-Toluene-sulfonic Acid (wt %) | | | | 5 | 5 | 5 |
| HCl (wt %) | 0.36 | 0.72 | 1.8 | 0.36 | 0.72 | 1.8 |
| $H_2O_2$ 31%(g/100 g) | 1 | 1 | 1 | 1 | 1 | 1 |
| Temp ° C. | 60 | 60 | 60 | 80 | 80 | 80 |
| Dipping time (min) | 10 | 10 | 10 | 10 | 10 | 10 |
| Dissolved Sn (μg) | 1.1 | 1.3 | 1.8 | 5.2 | 14.2 | 289.3 |

The aqueous sulfonic acid cleaning compositions of Examples 25-30 were homogeneous and stable and showed good tin removal in contrast to the non-homogeneous comparative Examples 23-24 above.

What is claimed is:

1. A method of removing contaminants from an extreme ultra-violet mask comprising:
   a) inspecting the extreme ultra-violet mask for contaminants;
   b) providing an aqueous cleaning composition consisting of water, a sulfonic acid or salt thereof, a source of chloride ions, optionally an oxidizing agent, and optionally a surfactant; and
   c) contacting the extreme ultra-violet mask with the aqueous cleaning composition comprising sulfonic acid and a source of chloride ions to remove at least tin from the extreme ultra-violet mask.

2. The method of claim 1, wherein the sulfonic acid has the formula:

R—S(=O)₂—OH     (I), wherein R is an alkyl or aryl group.

3. The method of claim 2, wherein R is $C_nH_{2n+1}$ and the variable n is an integer of 1 and greater.

4. The method of claim 3, wherein R is $C_nH_{2n+1}$ and the variable n is an integer of 1-4.

5. The method of claim 1, wherein the sulfonic acid is in amounts of at least 10 wt %.

6. The method of claim 5, wherein the sulfonic acid is in amounts of 15-65 wt %.

7. The method of claim 1, wherein the chloride ions are in amounts of at least 0.05 wt %.

8. The method of claim 7, wherein the chloride ions are in amounts of 0.1-5 wt %.

9. The method of claim 1, wherein the salt of the sulfonic acid has the formula:

R—S(=O)₂—O⁻Y⁺     (II), wherein R is an alkyl or aryl group and Y⁺ is a counter cation.

10. The method of claim 1, wherein the aqueous cleaning composition is at a temperature of at least 30° C.

11. The method of claim 10, wherein the aqueous cleaning composition is at 50-85° C.

12. A method of removing contaminants from an extreme ultra-violet mask comprising:
    a) inspecting the extreme ultra-violet mask for contaminants;
    b) providing an aqueous cleaning composition consisting of water, a source of chloride ions, a sulfonic acid or salt thereof having the formula:

R—S(=O)₂—OH     (I), wherein R is an alkyl or aryl group, optionally an oxidizing agent and optionally a surfactant; and
    c) contacting the extreme ultra-violet mask with the aqueous cleaning composition to remove at least tin from the extreme ultra-violet mask.

* * * * *